United States Patent
Jain et al.

(10) Patent No.: US 12,373,613 B2
(45) Date of Patent: Jul. 29, 2025

(54) CONSTRUCTION KNOWLEDGE GRAPH

(71) Applicant: Procore Technologies, Inc., Carpinteria, CA (US)

(72) Inventors: Manish Jain, Los Angeles, CA (US); Alvaro J. Soto, Austin, TX (US); Adam S. Jilani, Austin, TX (US); Ripple Priya Goyal, Los Angeles, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 642 days.

(21) Appl. No.: 17/307,869

(22) Filed: May 4, 2021

(65) Prior Publication Data
US 2022/0358259 A1    Nov. 10, 2022

(51) Int. Cl.
*G06F 30/13*    (2020.01)
*G06N 5/022*    (2023.01)
*G06N 20/20*    (2019.01)

(52) U.S. Cl.
CPC ............. *G06F 30/13* (2020.01); *G06N 5/022* (2013.01); *G06N 20/20* (2019.01)

(58) Field of Classification Search
CPC .......... G06F 30/13; G06F 30/27; G06F 30/20; G06N 5/022; G06N 20/20; G06N 20/00
See application file for complete search history.

(56) References Cited

U.S. PATENT DOCUMENTS

| | | | |
|---|---|---|---|
| 7,433,885 B2 | 10/2008 | Jones | |
| 10,496,678 B1 | 12/2019 | Tang | |
| 11,157,505 B2 * | 10/2021 | Gutiérrez | ............... G06F 9/451 |
| 2012/0203806 A1 | 8/2012 | Panushev | |

(Continued)

FOREIGN PATENT DOCUMENTS

| | | | | |
|---|---|---|---|---|
| CN | 112612908 A | * | 4/2021 | ............. G06F 16/36 |
| KR | 1020200015642 A | | 2/2020 | |
| WO | WO 2015195231 A1 | * | 12/2015 | ............. G01C 21/20 |

OTHER PUBLICATIONS

International Searching Authority, PCT International Search Report and Written Opinion, PCT International Application No. PCT/US2022/027680, dated Aug. 23, 2022, 10 pages.

(Continued)

*Primary Examiner* — Rehana Perveen
*Assistant Examiner* — Troy A Maust
(74) *Attorney, Agent, or Firm* — Lee Sullivan Shea & Smith LLP

(57) ABSTRACT

An example computing platform is configured to (i) receive a data asset related to a construction project; (ii) determine, via a first machine-learning algorithm, at least one physical location within the construction project to which the received data asset is related; (iii) associate the received data asset with the determined physical location; (iv) based on the determined physical location, determine, via a second machine-learning algorithm, a respective relationship between the received data asset and one or more other data assets related to the construction project; and (v) add the received data asset to a construction knowledge graph as a node that is connected to one or more other respective nodes that represent the one or more other data assets.

21 Claims, 11 Drawing Sheets

(56) References Cited

U.S. PATENT DOCUMENTS

| | | | |
|---|---|---|---|
| 2013/0132146 A1* | 5/2013 | Pye | G06Q 10/06 |
| | | | 705/7.22 |
| 2014/0337286 A1 | 11/2014 | Omansky et al. | |
| 2017/0017903 A1* | 1/2017 | Gray | G06T 11/60 |
| 2017/0076365 A1* | 3/2017 | D'Souza | G06Q 50/163 |
| 2020/0026922 A1* | 1/2020 | Pekelny | G06T 19/006 |
| 2020/0286616 A1* | 9/2020 | Dunn | G06Q 40/08 |
| 2020/0293712 A1* | 9/2020 | Potts | G06F 40/169 |
| 2020/0311134 A1* | 10/2020 | Reddy | G06N 5/022 |
| 2021/0072709 A1* | 3/2021 | Oliver | G06F 16/24575 |
| 2021/0073449 A1* | 3/2021 | Segev | G06F 30/27 |
| 2021/0219257 A1* | 7/2021 | Anand | H04W 64/006 |
| 2021/0287177 A1* | 9/2021 | Musialek | G06Q 10/06312 |

OTHER PUBLICATIONS

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

"What's a Common Data Environment (CDE)?", Digital Builder, https://constructionblog.autodesk.com/common-data-environment/, Dec. 1, 2019, downloaded from the Internet Jul. 6, 2021, 15 pages.

"Introducing the Knowledge Graph", Google, https://www.youtube.com/watch?v=mmQ16VGvX-c, May 16, 2012, downloaded from the Internet Jul. 6, 2021, 1 page.

* cited by examiner

CONSTRUCTION KNOWLEDGE GRAPH

BACKGROUND

Software applications are used on a regular basis to perform and manage tasks in users' personal and professional capacities. As some examples, software applications may assist users with managing tasks related to email communications, customer relationship management, billing and payroll processing, human resources management, and construction project design and management. Many other types of software applications exist.

Software applications handle a large volume of information and can be complex. It is therefore desirable for software applications to provide sophisticated features and tools which can enhance a user's ability to interact with the software application, obtain desired information, and improve the overall user experience. Thus, any tool that can improve a user's interaction with a software application is desired.

OVERVIEW

A construction project often involves the creation of an immense amount of information, involving a large number of different stakeholders that may be creators or consumers—often both—of such information. At the inception of a construction project an owner may coordinate with planners, architects, and engineers in a planning and design phase to define the scope and develop the design for the project (e.g., a new building). This phase may take months or years depending on the size of the project, and may result in the creation of project-specific design specifications, architectural plans, engineering plans, etc. These various different plans generally comprise visual representations of the construction project that visually communicate information about the construction project, such as how to assemble or construct different parts of the project. Such visual representations tend to take one of at least two different forms. One form may be a two-dimensional technical drawing in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.), or via software for viewing a two-dimensional drawing model.

As another possibility, a construction project's design plans may be represented by a three-dimensional model that is embodied in a computerized form, such as in a building information model (BIM) file, with three-dimensional meshes visually representing the physical elements of the construction project (e.g., walls, ducts, etc.). Specialized software is configured to edit and access the BIM file and render a three-dimensional view of the construction project from one or more perspectives.

Following the planning and design phase, a preconstruction phase may introduce additional stakeholders such as project managers, general contractors, and subcontractors, each of whom may work with estimators to prepare cost estimates for the project in order to prepare corresponding bids (e.g., bids to perform work on a certain portion of the project). In turn, the owner may award contracts to construction the project, and these contracts may contain additional terms and expectations regarding the project's construction, including a project budget and contingencies.

Thereafter, the construction managers and/or contractors may generate still further information for the project, including additional bidding and selection of subcontractors within different trades (e.g., concrete, masonry, carpentry, plumbing, etc.), risk management plans, safety plans, and a work breakdown structure, which is a listing of activities (e.g., pouring a foundation, installing a door, etc.) and the tasks required to complete each activity. In this regard, a typical construction project may include thousands of such activities that may need to be broken down in order to create a clear roadmap for the construction process.

Relatedly, a scheduler may develop a project schedule that orders all of the activities in the work breakdown structure and establishes the timing of construction. For instance, a project schedule may establish a critical path of activities that dictates the longest time to project completion, may identify activities that can be performed in parallel, and may include milestones for certain activities to assist project managers with assessing whether a project is on schedule.

The construction phase may follow, sometimes referred to as the execution phase. During this phase, contractors and subcontractors order and take delivery of materials, update their individual budgets, establish labor management plans and monthly, weekly, or daily schedules, and generally construct the project. Once construction is underway, a project manager or general contractor may track the work that is performed in relation to the project schedule, as well as the quality of the work that is performed in relation to the design specifications. Further, the project manager or general contractor may track the project budget as construction progresses.

In addition to the information discussed above that is continually being generated throughout the construction phase, changes will invariably occur in every construction project. For example, construction materials may suffer from shortages or delivery delays or the weather may prevent some work from being completed when planned, or an object may be installed incorrectly requiring it to be removed and reinstalled, leading to updates to the project schedule. As another possibility, the architectural or engineering drawings may need to be revised to account for unforeseen field conditions, to correct a design error, or to incorporate an owner-directed change. In these situations, a change order may be generated, submitted to one or more stakeholder for approval and analysis (e.g., to determine the impact to the project budget and/or schedule). Once approved, a drawing revision may be issued and the two-dimensional technical drawings and/or three-dimensional model may be updated accordingly, or a sketch may be provided in lieu of updating the drawings. Similarly, the project budget may be updated to reflect the approved change order, and a revised schedule may be developed. In other situations, a change order might affect some aspects of the construction project but not others—e.g., a change order may not affect the drawings or the budget but may impact the schedule.

In some cases, a given change to a project during construction may have a cascading effect, not only due to the direct impacts the change might have on the budget or schedule, but also due to the indirect impacts that may arise. For example, a change to the size or location of a piece of mechanical equipment within a building may require a change to a wall configuration, which in turn may require repositioning of electrical conduit that was designed to be placed within the walls, and so on. At the construction stage, each of these changes may affect a different subcontractor's scope of work, budget, and schedule, all of which may need to be incorporated into the overall project budget and schedule. Accordingly, accounting for changes can generate still further information during the course of a construction project. In general, coordinating, tracking, and recording information related to changes requires a substantial amount of time and effort among the various stakeholders, and can be a considerable challenge.

Another common source of information during construction are requests for information, or RFIs, that are generated by one of the stakeholders involved in construction. RFIs are used to clarify ambiguities, answer questions, and fill information gaps that occur during the construction process, sometimes resulting in change orders. A typical scenario for creating an RFI is when a subcontractor or superintendent requires specific information from the project's architect or engineer to complete an activity or task. For example, a project drawing might be unclear, a requirement may be vague, a product specification might be outdated, inaccurate, or incomplete, or a field-driven change order may require additional input from the architect or engineer. In such cases, an RFI is generated and responsibility for answering the RFI is assigned. Once answered, the response to the RFI is recorded. A given construction project might generate hundreds of RFIs, some of which may result in change orders. Accordingly, tracking of outstanding RFIs is important to prevent miscommunication, project delays, and/or rework.

Near the end of the construction phase, punch lists are generally created to the list the items on the project that must be corrected or otherwise completed before the project is closed out. A given punch list item might be assigned to, and require a response from, any of the subcontractors who performed work on the project. In many cases, final inspections and certifications must be carried out for various systems and equipment within the project.

Eventually, the construction phase is completed and the project moves to a closeout phase, where the owner takes control of the project. Typically, this involves the handover of a substantial amount of information from the stakeholders involved in the construction phase to the owner regarding the finished state of the project. For instance, this information may include as-built drawings, all RFIs and changes orders created during construction and their resolution, punch list details, final inspection records, etc. As detailed above, this universe of information can be substantial.

It should be understood that the brief description of a typical construction project above represents one possible example and discusses only some of the many different sources of information that may exist for a given project.

Today, the construction industry as a whole suffers from various inefficiencies related to this vast amount of information associated with a given construction project. By some estimates, 30% of the data that is created during the design and construction phases is lost by the time the project reaches the closeout phase. Frequently, these inefficiencies stem from the siloed structure of much of this data. Even when desired information is not lost, it can be difficult to locate because of these data silos and a general lack of meaningful connectivity between the information.

Consider the example discussed above in which a change to a piece of mechanical equipment causes a change to a wall configuration, which in turn results in a change to the location of an electrical conduit. At a later time, the owner or another stakeholder may want to review information regarding why the location of the electrical conduit was changed from its original location, when it was changed, who requested the change, who approved it, whether the change was the result of an RFI and if so, who was associated with it, whether there was an additional cost associated with the change, whether the change affected the project schedule, the inspection status of the electrical system, and so on. Unfortunately, much of this desired information is likely to be located in disparate data silos maintained by multiple different custodians of this information and may take a substantial amount of time to track down, if the owner has access to it at all.

Some possible solutions have been proposed to address these types of inefficiencies, including the use of a so-called common data environment, or CDE, which attempts to break down data silos by collecting the data generated during a construction project in a centralized digital location that all stakeholders can access. However, while this may address some of the problems related to data loss, it does not address the issue facing the owner in the example above, which stems from a lack of data connectivity. In particular, even though all of the questions the owner is asking may be intuitively related in the owner's mind, the data itself nonetheless lacks any unifying characteristic that can serve as a common denominator to link it together and to easily surface all of the answers to these questions. For example, the desired data is not related by a single construction division, as it relates to changes in the electrical, finishes, and mechanical divisions. Nor is the desired data related by a single data type, as the owner is seeking information that may be contained in drawings, change orders, RFIs, cost estimates, and project schedules, etc. Thus, even in a CDE in which all of the desired information may be technically available, the owner may still need to spend a significant amount of time following one or more disparate data trails to find it all.

To address these and other problems with existing technology that is used for the management of construction project information, disclosed herein is new software technology that utilizes machine-learning models to ingest new data that is generated throughout the construction process and associate the data with a physical location within the construction project. By using location as a unifier for all types of construction data in this way, relationships between data assets can be established and used to create a construction knowledge graph that reflects the connectivity between different types of data assets. This increased connectivity may improve the delivery of desired information both on demand (e.g., in response to targeted user searches) and through proactive, automated experiences (e.g., using predictive analytics to generate notifications to users).

Virtually all data that is created during the course of a construction project refers either directly or indirectly to one or more locations within the construction project. For example, a construction project's design plans are typically based on a coordinate system that is used as the basis to locate the physical objects that are to be constructed (e.g., foundations, walls, pipes, etc.). In some cases, a construction project's coordinate system is derived from one or more universal location sources such as a particular latitude/longitude or one or more GIS benchmarks, etc. However, the design plans are often based on a construction-project specific datum, sometimes referred to as "virtual coordinates." Virtual coordinates typically set a point within the construction project as the origin (e.g., a building corner, or a property boundary point of the construction project, etc.) and then the location of the various objects to be constructed within a BIM file or a two-dimensional plan are determined based on this origin point, which is treated as (0,0,0). Accordingly, each object to be constructed may be associated with a set of (x,y,z) values (e.g., a range of (x,y,z) values corresponding to the object's geometry) that describe the object's location within the project.

However, apart from the construction plans themselves, other data assets that are created during the course of a construction project generally do not contain such location-based associations inherently within their data, even though they may be related to a location in some way. For instance, cost estimates and bid information may represented as rows within a spreadsheet, work breakdown schedules may be represented as nested lists of activities and tasks, and project schedules may be represented as bar graphs plotting work to be performed vs. time. Further, RFIs may be represented as a textual request for information, and a corresponding answer. In this regard, although an RFI may refer to a specific object that has a defined (x,y,z) location within the project's coordinate system, this location information, while embodied in the design plans, may not be associated with the RFI. Similarly, although change orders, punch lists, inspection reports and the like may also refer to particular objects, the location information for the objects in question, while embodied in the design plans, may not be associated with these types of data assets either.

Accordingly, a computing platform may utilize the disclosed software technology to determine a physical location within the construction project to which each data asset is related and then associate the data asset with the determined location. In some examples, a given data asset may be associated with multiple locations, such as a punch list that refers to several different objects. Determining the location within the construction project to which a given data asset is related may involve one or more machine-learning algorithms, as discussed further below.

Data assets that are associated with location in this way may be used by the computing platform to build a construction knowledge graph for the project that uses location as a common denominator to unify data that would otherwise remain disconnected. For example, each data asset (e.g., a cost estimate, a schedule, an RFI, etc.) may become a node in the construction knowledge graph. Further, each physical object represented in the construction drawings may represent a distinct node of the construction knowledge graph.

The computing platform may additionally establish connections, or edges, between the nodes of the construction knowledge graph that represent the relationships between the nodes and are defined in a way that reflects the nature of the relationship. The edges may be determined using one or more machine-learning models, as discussed in further detail below. As one example, the computing platform may determine that an RFI (e.g., a first data asst) referring to an object, such as a door (e.g., a second data asset), is directly related to the door and thus may associate the RFI with the door's physical location. The computing platform may further determine that the door is related to a cost estimate (e.g., a third data asset) that includes the door as a line item and thus the cost estimate may also be associated (e.g., in part) with the door's physical location.

As new data assets are generated during the construction project, they may be incorporated as nodes into the construction knowledge graph accordingly, which may provide numerous benefits related to the accessibility and delivery of information related to the project. For instance, a stakeholder that is seeking information about a particular object in the construction project may be able to easily locate and review data assets that were associated with the object's location. The computing platform may also be configured to utilize the construction knowledge graph, in connection with machine-learning models that are trained on historical construction data sets, to predict likely relationships between data assets. For example, the computing platform may predict that a change order that is associated with one object is likely to have an impact on certain nearby objects. Accordingly, the computing platform may generate a notification for presentation to one or more stakeholders related to the change order's potential impact. Other examples are also possible.

In line with the discussion above, the disclosed technology may be implemented as one or more software applications that facilitate the creation and management of data during the course of a construction project, some examples of which may include the types of software applications developed by Procore Technologies. Further, in practice, the computing platform in which the disclosed technology is incorporated may take the form of a software as a service ("SaaS") application that comprises a front-end software component running on a user's client station and a back-end software component running on a back-end computing platform that is accessible to the user client station via a communication network such as the Internet.

Accordingly, in one aspect, disclosed herein is a method that involves a computing platform (i) receiving a data asset related to a construction project, (ii) determining, via a first machine-learning algorithm, at least one physical location within the construction project to which the received data asset is related, (iii) associating the received data asset with the determined physical location, (iv) based on the determined physical location, determining, via a second machine-learning algorithm, a respective relationship between the received data asset and one or more other data assets related to the construction project, and (v) adding the received data asset to a construction knowledge graph as a node that is connected to one or more other respective nodes that represent the one or more other data assets.

In some example embodiments, determining the physical location within the construction project to which the received data asset is related may involve identifying, within the data asset, an indication of at least one of the one or more other data assets, where the at least one of the one or more other data assets is related to the physical location.

Further, in example embodiments, identifying an indication of at least one of the one or more other data assets may involve (i) identifying an indication of a design object that is associated with location coordinates within the construction project and (ii) determining that the location coordinates associated with the design object are the at least one physical location within the construction project to which the received data asset is related.

Further yet, in example embodiments, determining the respective relationship between the received data asset and one or more other data assets may involve determining that the physical location associated with the received data asset is within a threshold distance from a physical location associated with the one or more other data assets.

Still further, in some example embodiments, determining the respective relationship between the received data asset and one or more other data assets may involve determining a predicted relationship between the received data asset and a currently unrelated data asset.

Still further, in some example embodiments, the method may further involve (i) determining a node within the construction knowledge graph that (a) corresponds to a user and (b) is related to the received data asset and (ii) generating a notification of the predicted relationship for presentation on a client station associated with the user.

Still further, in some example embodiments, the respective connection between the received data asset and each other node in the construction knowledge graph includes an edge that characterizes the relationship between the received data asset and the other node.

In another aspect, disclosed herein is a computing platform that includes a network interface, at least one processor, a non-transitory computer-readable medium, and program instructions stored on the non-transitory computer-readable medium that are executable by the at least one processor to cause the computing platform to carry out the functions disclosed herein, including but not limited to the functions of the foregoing method.

In yet another aspect, disclosed herein is a non-transitory computer-readable storage medium provisioned with software that is executable to cause a computing platform to carry out the functions disclosed herein, including but not limited to the functions of the foregoing method.

One of ordinary skill in the art will appreciate these as well as numerous other aspects in reading the following disclosure.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. EXAMPLE NETWORK CONFIGURATION

As one possible implementation, this software technology may include both front-end client software running on one or more client stations that are accessible to client users of the software technology and back-end software running on a back-end platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end platform (e.g., a native software application). The software technology disclosed herein may take other forms as well.

Figure 1:
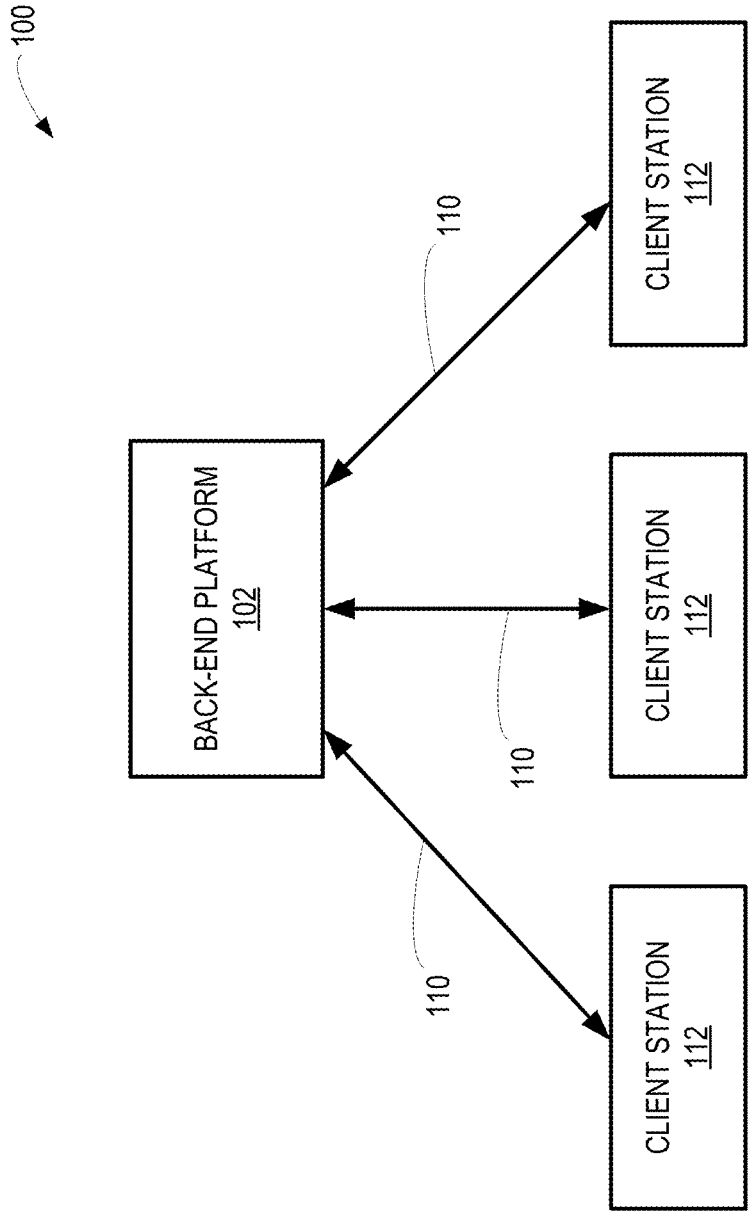
FIG. 1 depicts an example network configuration in which example embodiments may be implemented.

Turning now to the figures, FIG. 1 depicts an example network configuration 100 in which example embodiments of the present disclosure may be implemented. As shown in FIG. 1, network configuration 100 includes a back-end computing platform 102 that may be communicatively coupled to one or more client stations, depicted here, for the sake of discussion, as three client stations 112, 114, and 116.

In general, back-end computing platform 102 may comprise one or more computing systems that have been provisioned with software for carrying out one or more of the computing platform functions disclosed herein, including but not limited to functions related to outputting associated data and/or instructions that define the visual appearance of a front-end interface (e.g., a graphical user interface (GUI)) through which the data is to be presented on the one or more client stations. The one or more computing systems of back-end computing platform 102 may take various forms and be arranged in various manners.

For instance, as one possibility, back-end computing platform 102 may comprise computing infrastructure of a public, private, and/or hybrid cloud (e.g., computing and/or storage clusters) that has been provisioned with software for carrying out one or more of the computing platform functions disclosed herein. In this respect, the entity that owns and operates back-end computing platform 102 may either supply its own cloud infrastructure or may obtain the cloud infrastructure from a third-party provider of "on demand" computing resources, such as Amazon Web Services (AWS) or the like. As another possibility, back-end computing platform 102 may comprise one or more dedicated servers that have been provisioned with software for carrying out one or more of the computing platform functions disclosed herein. Other implementations of back-end computing platform 102 are possible as well.

In turn, client stations 112, 114, 116 may take any of various forms, examples of which may include a desktop computer, a laptop, a netbook, a tablet, a smartphone, and/or a personal digital assistant (PDA), among other possibilities.

As further depicted in FIG. 1, back-end computing platform 102 is configured to communicate with one or more client stations 112, 114, 116 over respective communication paths. Each communication path between back-end computing platform 102 and one of client stations 112, 114, 116 may generally comprise one or more communication networks and/or communications links, which may take any of various forms. For instance, each respective communication path with back-end computing platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path with back-end computing platform 102 may be wireless, wired, or some combination thereof, and may carry data according to any of various different communication protocols. Although not shown, the respective communication paths with back-end computing platform 102 may also include one or more intermediate systems. For example, it is possible that back-end computing platform 102 may communicate with a given client station 112, 114, 116 via one or more intermediary systems, such as a host server (not shown). Many other configurations are also possible.

Although not shown in FIG. 1, back-end computing platform 102 may also be configured to receive data from one or more external data sources that may be used to facilitate functions related to the disclosed process. For example, the back-end computing platform 102 may be configured to ingest data assets from external data sources and determine location-based associations for them, similar to data assets that are generated by the front-end client stations 112, 114, 116.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. EXAMPLE COMPUTING PLATFORM

Figure 2:
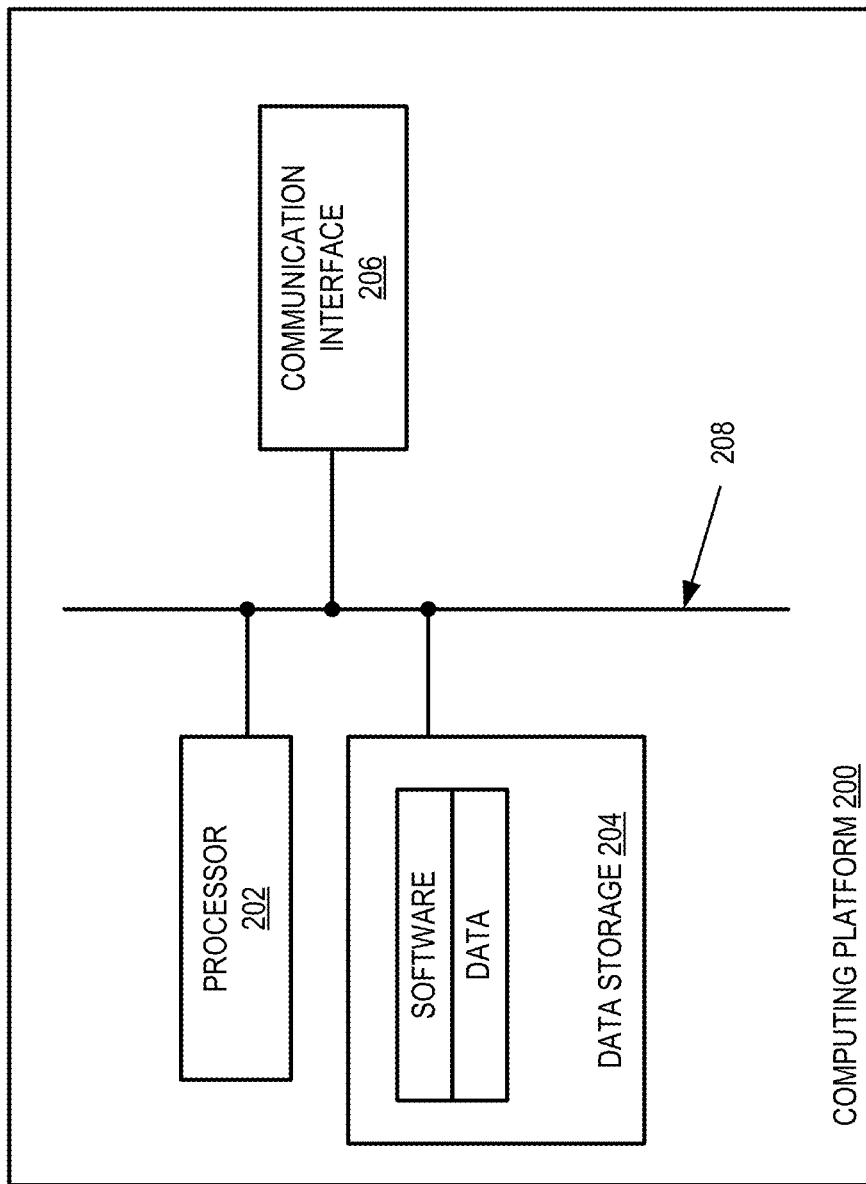
FIG. 2 depicts an example computing platform that may be configured to carry out one or more of the functions of the present disclosure.

FIG. 2 is a simplified block diagram illustrating some structural components that may be included in an example computing platform 200, which could serve as back-end computing platform 102 of FIG. 1. In line with the discussion above, platform 200 may generally comprise one or more computer systems (e.g., one or more servers), and these one or more computer systems may collectively include at least a processor 202, data storage 204, and a communication interface 206, all of which may be communicatively linked by a communication link 208 that may take the form of a system bus, a communication network such as a public, private, or hybrid cloud, or some other connection mechanism.

Processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums that are collectively configured to store (i) program instructions that are executable by processor 202 such that platform 200 is configured to perform some or all of the disclosed functions and (ii) data that may be received, derived, or otherwise stored, for example, in one or more databases, file systems, or the like, by platform 200 in connection with the disclosed functions. In this respect, the one or more non-transitory computer-readable storage mediums of data storage 204 may take various forms, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that data storage 204 may comprise computer-readable storage mediums that are distributed across a plurality of physical computing devices connected via a network, such as a storage cluster of a public, private, or hybrid cloud. Data storage 204 may take other forms and/or store data in other manners as well.

Communication interface 206 may be configured to facilitate wireless and/or wired communication with external data sources and/or client stations, such as client stations 112, 114, 116 in FIG. 1. Additionally, in an implementation where platform 200 comprises a plurality of physical computing devices connected via a network, communication interface 206 may be configured to facilitate wireless and/or wired communication between these physical computing devices (e.g., between computing and storage clusters in a cloud network). As such, communication interface 206 may take any suitable form for carrying out these functions, examples of which may include an Ethernet interface, a Wi-Fi network, a cellular network, a serial bus interface (e.g., Firewire, USB 3.0, etc.), a chipset and antenna adapted to facilitate wireless communication, short-range wireless protocols, and/or any other interface that provides for wireless and/or wired communication, among other possibilities. Communication interface 206 may also include multiple communication interfaces of different types. Other configurations are possible as well.

Although not shown, platform 200 may additionally include one or more interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with platform 200.

It should be understood that platform 200 is one example of a computing platform that may be used with the embodiments described herein. Numerous other arrangements are possible and contemplated herein. For instance, other computing platforms may include additional components not pictured and/or more or less of the pictured components.

III. EXAMPLE FUNCTIONALITY

As described above, the disclosed technology is generally directed to a new software technology that utilizes machine-learning models to create and maintain a construction knowledge graph that unifies data assets generated during a construction project by location, increasing the connectivity of all construction data and greatly improving the accessibility and usability of such data.

Figure 3:
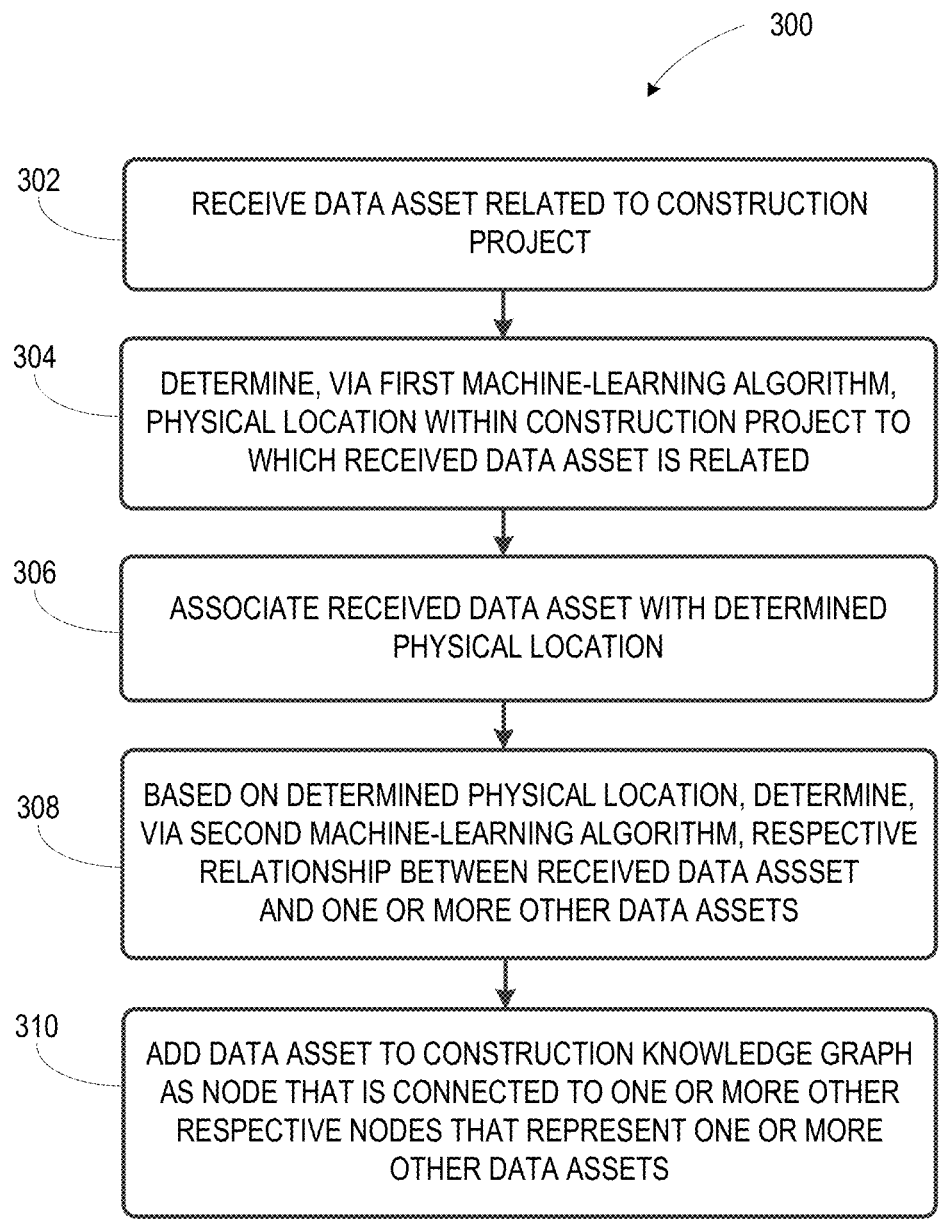
FIG. 3 depicts an example flow chart that may be carried out to facilitate creating a construction knowledge graph.

Turning to FIG. 3, a flow chart 300 is shown that includes example operations that may be carried out to facilitate the create creation of a construction knowledge graph. The example operations will be discussed with reference to FIG. 4, which depicts a block diagram of an example computing platform 400 that may carry out the example operations. In this regard, the computing platform 400 may be similar to the back-end computing platform 102 of FIG. 1 and/or the computing platform 200 of FIG. 2.

Figure 4:
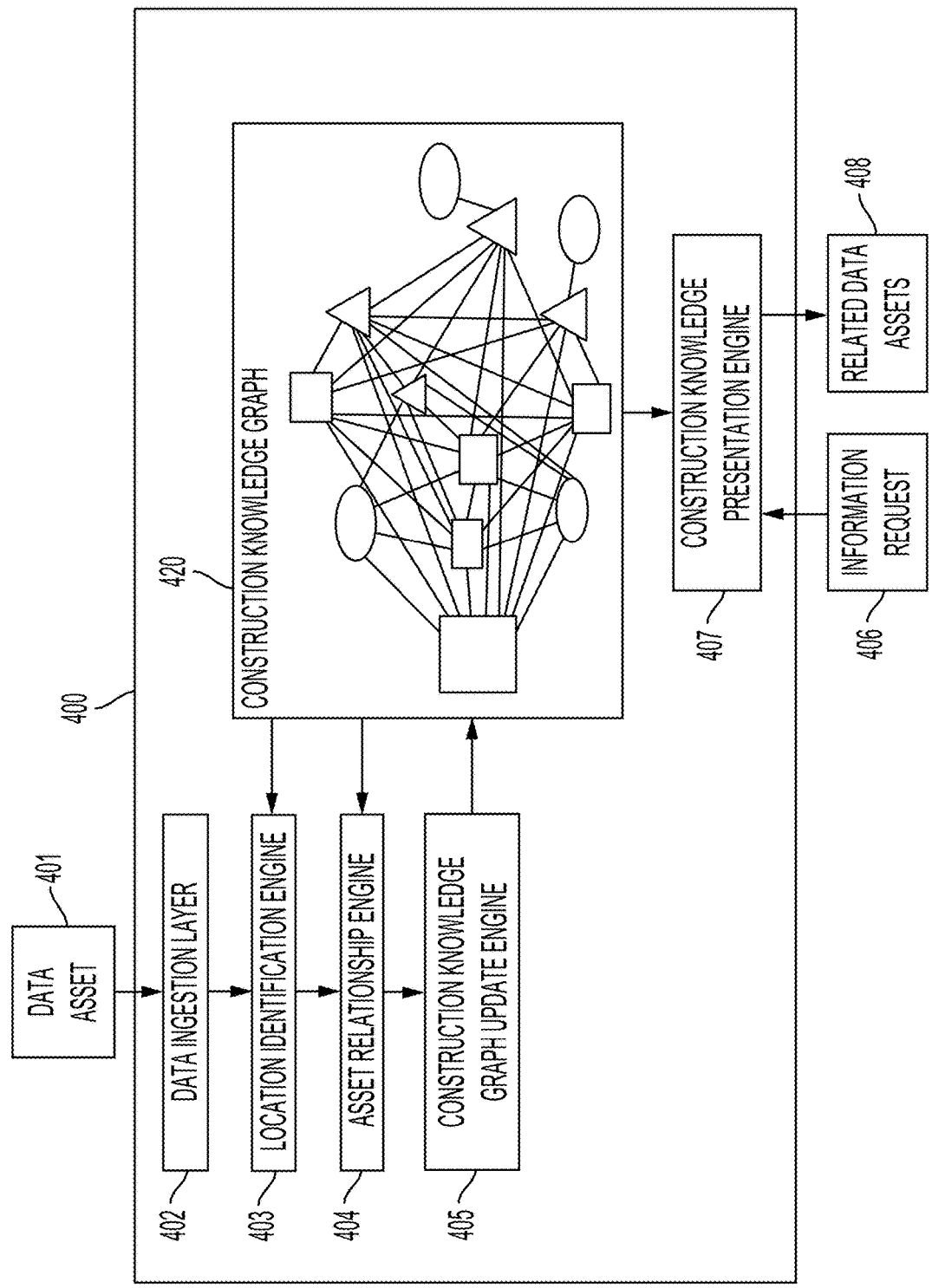
FIG. 4 depicts a simplified block diagram of a computing platform and example data flows related to a construction knowledge graph.

At block 302, the computing platform 400 may receive a data asset related to a construction project, shown as a data asset 401 in FIG. 4. As discussed above, the data asset 401 may correspond to numerous different types of information related to the construction project and may take various forms. As just some examples, the data asset 401 may be a construction drawing, a cost estimate, an RFI, or an inspection report, among other possibilities.

Further, the data asset 401 may be received from an equally diverse set of sources. As one possibility, a user of a front-end client station, such as the client station 112 in FIG. 1, may input information to the client station 112 to create the data asset 401, which is then provided to the computing platform 400. As another possibility, the computing platform 400 may receive the data asset 401 from an external data source that is not part of the example network configuration shown in FIG. 1. For instance, the computing platform 400 may be configures to import data assets related to the construction project that were created by other software tools.

As shown in FIG. 4, the computing platform 400 may receive the data asset 401 via a data ingestion layer 402. In this regard, the data ingestion layer 402 may take various forms, including one or more data ingestion tools that process and prepare the incoming data asset 401 for use by other components of the computing platform 400.

At block 304, the computing platform 400 may determine, via a first machine-learning algorithm, a physical location within the construction project to which the data asset 401 is related. The first machine-learning algorithm may form part of a location identification engine 403 of the computing platform 400, as shown in FIG. 4. As an initial matter, the location identification engine 403 may utilize a virtual coordinate system that is established during the creation of the design plans for the construction project, as noted above. Accordingly, each physical object represented within the design plans may be associated with the location(s) corresponding to its particular geometry within the virtual coordinate system. For example, a wall may be associated with a set of (x,y,z) values in the virtual coordinate system that correspond to the width, height, and depth of the wall. Further, each object within the design plans may be associated with a globally unique identifier (GUID) that may be used to identify the object. In this way, the physical objects represented in the design plans may form a baseline set of location-associated data assets within the construction project.

As additional data assets are ingested by the computing platform 400, the first machine-learning algorithm may be used to analyze the data assets and associate them to the location(s) in the virtual coordinate system to which they are related. The first machine-learning algorithm may take various forms. As one possibility, the first machine-learning algorithm may be trained using historical data sets from past construction projects whose data assets have been manually curated and associated with locations within their respective projects to which they are related. In this way, the first machine-learning algorithm may learn to identify a given data asset's relationship to a physical location within a construction project based on information contained in the data asset. For example, based on training data in which numerous work breakdown schedules across one or more historical construction projects are associated with physical objects and locations to which they refer, the first machine-learning algorithm may learn to associate a given work breakdown schedule with physical objects and locations in a given construction project based on the textual descriptions of the activities and tasks in the work breakdown schedule.

As another example, based on training data in which numerous RFIs across one or more historical construction projects are associated with physical objects and locations to which they refer, the first machine-learning algorithm may learn to recognize words and phrases within an RFI that match, or are similar to, a particular location or area of the construction project. For example, words and phrases in an RFI like "restroom" "exterior wall" may provide an indication of a physical location within the project, as can references to a specific construction drawing such as "Sheet A5" or references to a specific element in a drawing, such as "Room 405." Similar text-based correlations may be used to associate other types of data assets (e.g., change orders, inspection reports, etc.) with physical locations within the construction project as well.

It will be appreciated that the first machine-learning algorithm may determine a respective physical location associated with different data assets with different degrees of granularity, depending on the information included in the data asset. As one example, a data asset may include a reference to a GUID of an object in the construction plans, and thus the data asset may be associated with a relatively specific physical location in the construction project corresponding to the object. As another example, a data asset might include more general information, such as a reference to "reception area lighting," and thus the data asset may be associated with a relatively more general physical location, such as the physical location (e.g., multiple locations) corresponding to all lighting fixtures in the reception area. Numerous other examples are also possible.

At block 306, the computing platform 400 may associate the data asset 401 with the determined physical location. For example, after utilizing the first machine-learning algorithm to determine the physical location as discussed above, the location identification engine 403 may update a data record for the data asset 401 to include an indication of a set of (x,y,z) values in the virtual coordinate system that correspond to the determined physical location.

At block 308, the computing platform 400 may, based on the determined physical location, determine a respective relationship between the data asset 401 and one or more other data assets related to the construction project. In this way, the computing platform may assemble a construction knowledge graph from the construction projects data assets, which is shown schematically in FIG. 4 as the construction graph 420.

The computing platform 400 may determine a respective relationship between the data asset 401 and one or more other data assets related to the construction project in various ways. For instance, as shown in FIG. 4, the computing platform 400 may utilize an asset relationship engine 404 that applies a second machine-learning algorithm to determine the respective relationships between data assets. Similar to the first machine-learning algorithm discussed above, the second machine-learning algorithm may be trained using historical data sets from past construction projects (e.g., the same historical data sets) that have been manually curated and updated to include relationship information between data assets. In some cases, the data assets from a past construction project may be assembled as a set of nodes and edges (i.e., relationships) into a historical construction knowledge graph that provides a basis for the second machine-learning algorithm to recognize relationships between a newly ingested data asset and other data assets within the construction project.

In this regard, it should be understood that the data assets that are ingested by the computing platform 400, and thus the nodes that make up the knowledge graph 420 (or a historical knowledge graph that is assembled for training purposes), are not limited to data assets that are directly associated with locations in the construction project or work that is to be performed, as generally discussed thus far. For example, stakeholders involved in the construction project (e.g., people, companies, etc.) may also be added as nodes in the graph and connected to other nodes by appropriate relationships.

As shown in FIG. 4, the asset relationship engine 404 may use the current state of the construction knowledge graph 420 as input. For example, the asset relationship engine 404 may utilize the second machine-learning algorithm to determine which data assets that are already represented as nodes in the construction knowledge graph 420 are likely to be related to the data asset 401. Accordingly, after incorporating the data asset 401 into the construction knowledge graph 420, the computing platform 400 may utilize the updated construction knowledge graph 420 to inform relationships of additional data assets that are added.

At block 310, the computing platform 400 may add the data asset 401 to the construction knowledge graph 420 as a node that is connected to one or more other respective nodes that represent the one or more other data assets to which the data asset 401 is related. As shown in FIG. 4, this operation may be carried out by a construction knowledge graph update engine 405 that updates the construction knowledge graph 420 with the additional node and relationship information. In some cases, the data asset 401 may be added to the construction knowledge graph 420 as a particular node type that corresponds to the data asset 401. For example, physical objects represented in the construction plans may be designated as a first node type, people and other entities may be designated as a second node type, and informational data assets such as RFIs and project schedules may be designated as a third node type. Further breakdown of data assets into different node types is also possible.

The relationships determined by the asset relationship engine 404 may be similarly specific, such that each edge that is added to the construction knowledge graph 420 by the construction knowledge graph update engine 405 contains information characterizing the nature of the relationship. For instance, the data asset 401 may be an RFI that is added as a node to the construction knowledge graph 420 and connected by a "requests/contains information about" edge to another node representing the physical object mentioned in the RFI. Further, the node of data asset 401 may be connected by a "created by" edge to yet another node representing the sub-contractor who submitted the RFI. Numerous other edges are also possible that may characterize the different relationships between nodes.

In addition to the benefits discussed above related to increasing the underlying information connectivity of data assets during the course of a construction project, the computing platform 400 may also provide a system for the intelligent presentation of construction knowledge to users based on the information within the construction knowledge graph 420. As shown in FIG. 4, the computing platform 400 may receive an information request 406 related to the construction project. The information request 406 may take various forms. As one possibility, the information request 406 may originate from a front-end client station, such as the client station 112 in FIG. 1, on which a user may be utilizing a visualization tool to view a two-dimensional drawing file. For example, the user may select an area of object within the two-dimensional drawing file, which may be interpreted as a request for information related to the selected area or object.

As another possibility, the user may be utilizing a software tool for reviewing RFIs, change order, or some other aspect of the construction project that may not have a construction drawing visualization component. Within this tool, the user may selection an option to view other data assets (e.g., contract information, project schedules, etc.) related to a particular RFI or change order that they are reviewing. Numerous other examples of the information request 406 are also possible.

The information request 406 may be received by the computing platform 400 via a construction knowledge presentation engine 407, as shown in FIG. 4. In response, the computing platform 400 may determine one or more data assets in the construction knowledge graph 420 that are related to the information request 406 and may cause an indication of the one or more data assets to be displayed via the user's client station 112.

The computing platform 400 may determine the relatedness of data assets in the construction knowledge graph 420 to the information request 406 based on a variety of factors including a physical location within the construction project related to the request, the software tool utilized to make the request, information related to the user (e.g., the user's role on the construction project, access permissions, etc.), among numerous other possibilities. Additional examples related to the presentation of construction knowledge contained in the construction knowledge graph 520 in response to information requests will be further discussed in relation to FIGS. 6-8 below.

Figure 5A:
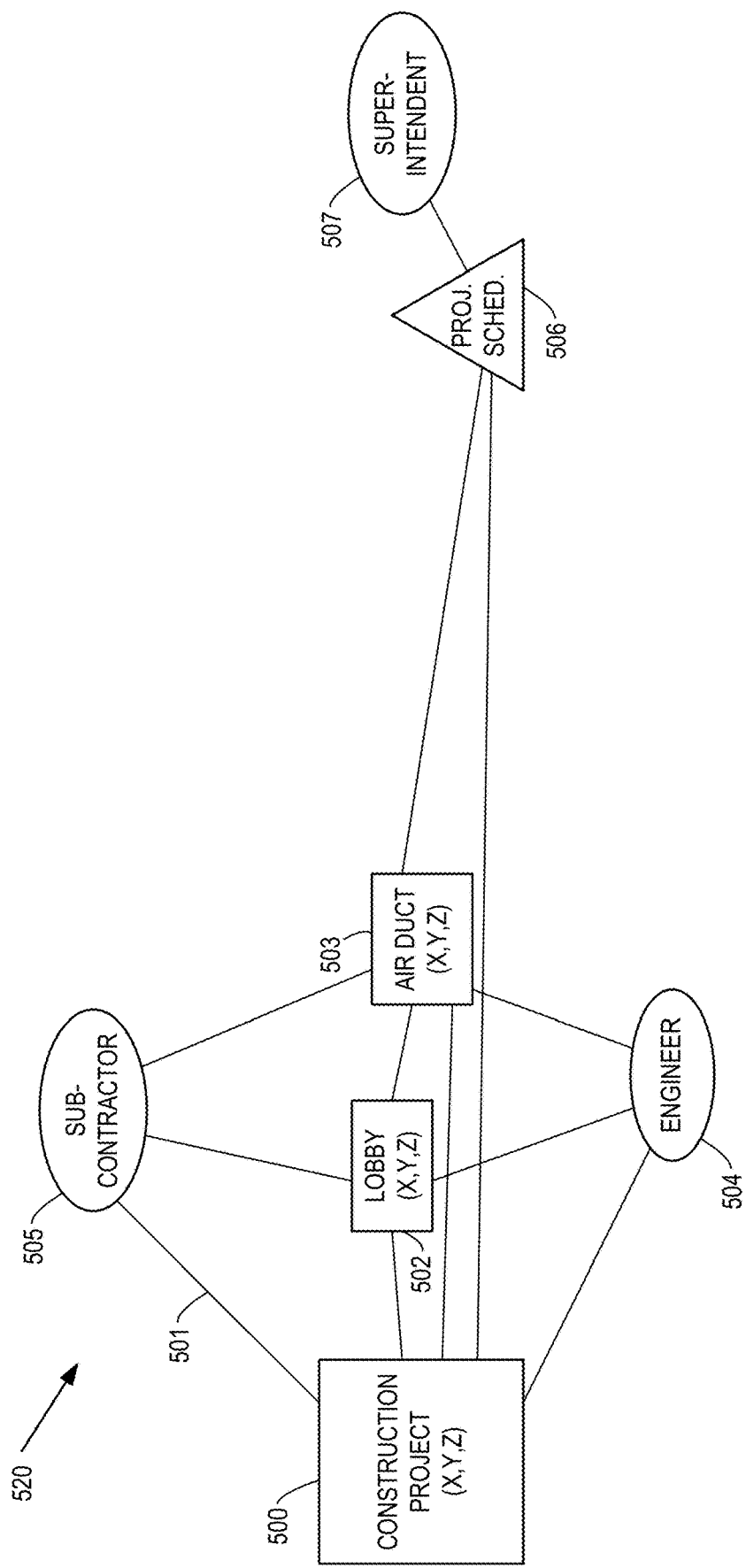
FIG. 5A depicts a schematic example of a construction knowledge graph according to one possible implementation.
Figure 5B:
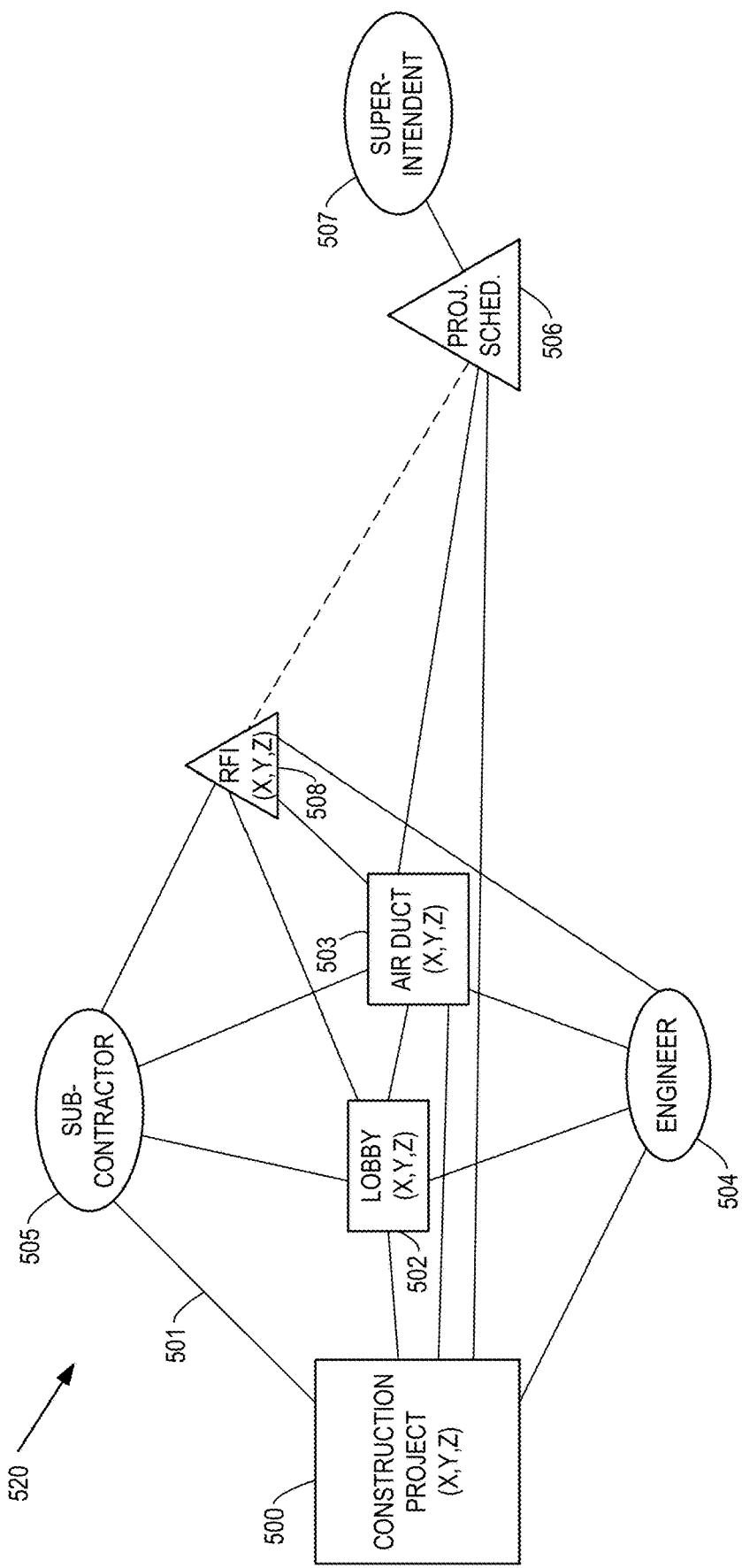
FIG. 5B depicts another schematic example of the construction knowledge graph of FIG. 5A.
Figure 5C:
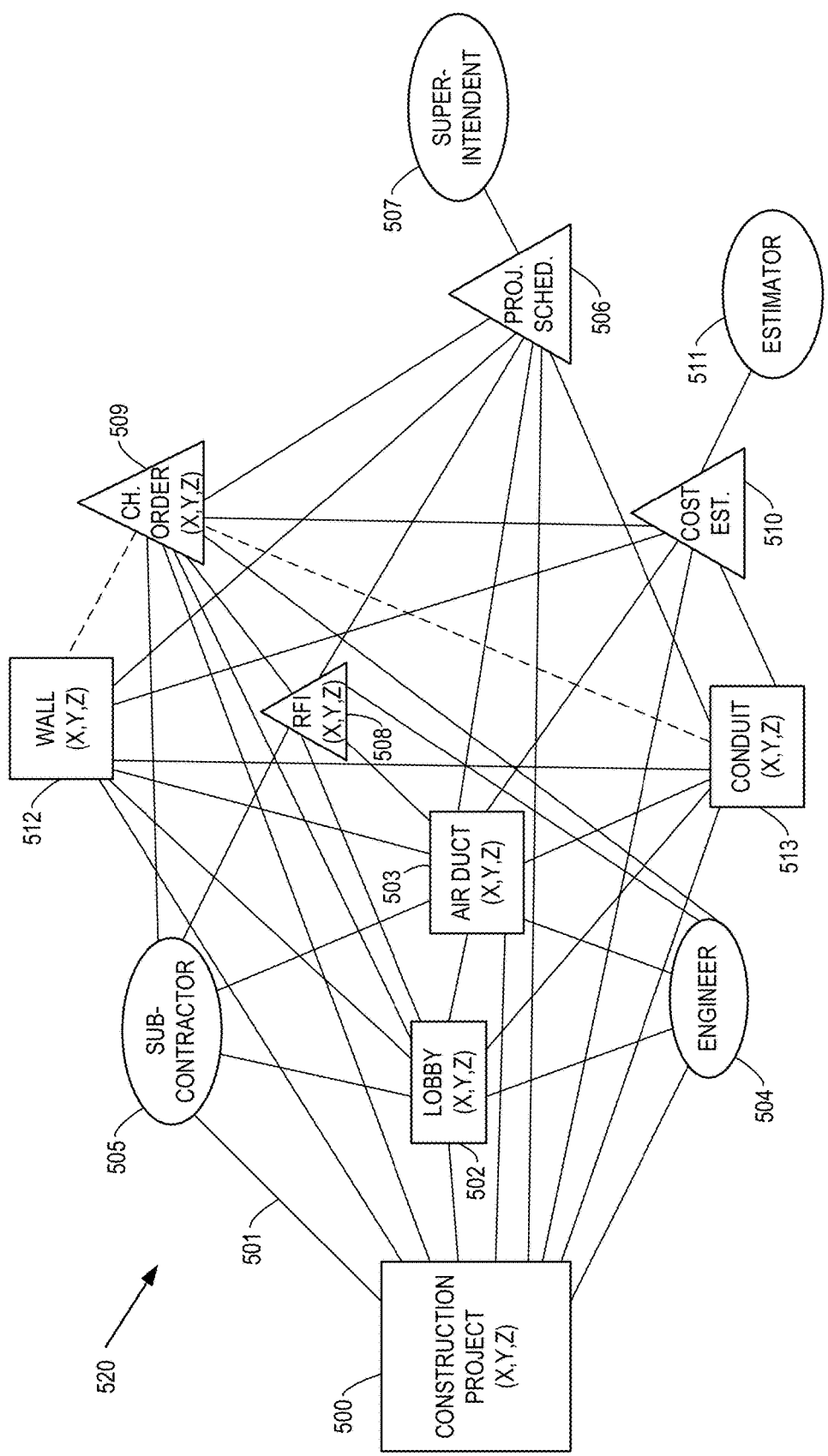
FIG. 5C depicts another schematic example of the construction knowledge graph of FIGS. 5A-5B.

Turning now to FIGS. 5A-5C, a schematic example depicting a construction knowledge graph 520 is shown and will serve as the basis to describe some example implementations. The construction knowledge graph 520 may be similar to the graph 420 shown in FIG. 4 and discussed above. For instance, the construction knowledge graph 520 may be created by a computing platform, such as the computing platform 400, according to the operations shown in FIG. 3.

It should be understood that the construction knowledge graph 520 shown in FIG. 5A may represent only a small portion of the overall construction knowledge graph for the construction project, which might include substantially more nodes. In addition, not every edge that may exist between the nodes of construction knowledge graph 520 is depicted. For instance, every node in the construction knowledge graph 520 may be related, as part of the overall construction project, to the node 500. However, many of these edges are omitted for the sake of clarity and ease of explanation.

As shown in FIG. 5A, the construction knowledge graph 520 includes various nodes that correspond to data assets related to the construction project, with differently-shaped nodes corresponding to different types of data assets. For instance, data assets that correspond to physical objects or spatial locations within the construction project are represented by rectangular nodes, people and similar entity-based data assets are represented by oval-shaped nodes, and informational data assets are represented by triangular nodes. For example, a node 500 may represent the overall construction project. The node 500 may include identifying information for the construction project, such as a project name, as well as information that defines the coordinate system on which the construction project is based, such as a virtual coordinate system that establishes a local origin point in (x,y,z) coordinate space, as discussed above.

Connecting the various nodes of the construction knowledge graph 520 and characterizing the relationships between the nodes are various edges, such as the edge 501 that connects the node 500 with a node 505 corresponding to a particular sub-contractor. For example, the edge 501 may characterize the sub-contractor as "is contracted to work on"

the construction project (e.g., construction of a building). Although the edge 501 may characterize a relatively generic relationship, this may be a by-product of the node 500 corresponding to a relatively generic data asset, i.e., the entire construction project. On the other hand, the edges between the node 505 and more specific data assets, such as the node 502 representing a particular location in the construction project (e.g., the building's lobby) or the node 503 representing a physical object 503 (e.g., an air duct in the building lobby), may characterize more specific relationships. For example, the edge between nodes 505 and 503 may characterize the sub-contractor as "responsible for installation of" the air duct. For the sake of clarity in depicting FIGS. 5A-5C, every edge shown in the construction knowledge graph 520 has not been assigned a reference number and will instead be identified for purposes of discussion by the respective nodes that they connect.

Continuing the present example, FIG. 5A further includes a node 504 corresponding to an engineer who was responsible for designing the mechanical equipment in the building lobby (e.g., a relationship characterized by the edge between nodes 504 and 502), and more specifically for designing the air duct (e.g., a relationship characterized by the edge between nodes 504 and 503). In this regard, the node 504 might represent an engineering firm responsible for the air duct design or might represent an individual engineer within the firm who has primary responsibility. In this case, the engineer's firm might be represented by a separate node (not shown) that is connected by corresponding edges to the nodes 500, 502, 503, etc. The same alternatives may apply to the node 505, which might represent an organization or an individual person.

Still further, the construction knowledge graph 520 depicts a node 506 corresponding to a project schedule for the construction project, which may include a detailed breakdown of when various objects depicted in the design plans are scheduled to be installed. Accordingly, the node 503 may be connected to the node 506 by an edge that characterizes the air duct as "scheduled for installation" on a particular day according to the project schedule. An additional node 507 corresponding to a project superintendent may be connected to the node 506 by an edge that characterizes the superintendent as "creator of" and/or "responsible for" the project schedule.

During the course of construction, the sub-contractor may encounter an unforeseen issue during installation of the air duct and may generate an RFI requesting information from the engineer for how to address the issue. For instance, the sub-contractor may utilize a RFI creation tool provided on a front-end client station, such as the client station 112 shown in FIG. 1. Accordingly, the RFI is generated and transmitted to the engineer for a response. In addition, a new data asset is created and received by the computing platform 400 for incorporation into the construction knowledge graph 520.

As discussed above, the computing platform 400 may determine, via the first machine-learning algorithm, a physical location within the construction project to which the data asset corresponding to the RFI is related. For example, the first machine-learning algorithm may consider some or all of that data contained within the RFI, including but not limited to the originator of the request (e.g., a sub-contractor within the mechanical trade), the party responsible for responding to the request (e.g., a mechanical engineer), when the request was made in relation to the project schedule (e.g., during installation of air ducts in the lobby). In this way, the first machine-learning algorithm may base its determination of location on some information that is already represented within the construction knowledge graph 520.

Based on the information discussed above, as well as other possible information, the first machine-learning algorithm may determine a relatively high likelihood that the RFI is related to a physical location corresponding to the lobby, and specifically the air ducts. Additionally, or alternatively, the RFI may refer to a particular air duct in the RFI, perhaps by referencing the air duct's GUID, making identification of the physical location to which the RFI is related relatively straight-forward. Accordingly, the computing platform 400 may associate the data asset representing the RFI with a set of (x,y,z) coordinates that correspond to the air ducts within the building lobby, or perhaps the specific (x,y,z) coordinates of the particular air duct in question if they could be determined by the first machine-learning algorithm.

Turning next to FIG. 5B, the computing platform 400 may determine, based on the determined (x,y,z) coordinates, respective relationships between the data asset corresponding to the RFI and one or more other data assets in the construction knowledge graph 520. Further, the computing platform 400 may add the data asset corresponding to the RFI to the construction knowledge graph 520 as a node 508 that is connected to the other related nodes by respective edges.

As noted above, the computing platform 400 may determine the relationships between the node 508 and the other nodes of the construction knowledge graph 520 in various way, including through the use of a second machine-learning algorithm. For example, the second machine-learning algorithm may consider some or all of that data contained within the data asset corresponding to the RFI, including the (x,y,z) location information now associated with the node 508. In doing so, the second machine-learning algorithm may determine the edge between nodes 505 and 508 representing that the RFI "was originated by" the subcontractor, the edge between nodes 504 and 508 representing that the RFI "requires a response from" the engineer, and the edge between nodes 503 and 508 representing that the RFI "requests/contains information about" the air duct.

In some implementations, the second machine-learning algorithm may be capable of predicting future relationships between nodes of the construction knowledge graph 520 that are likely to develop, which may provide significant advantages in certain situations. For example, the historical construction data that is used to train the second machine-learning algorithm may include numerous instances of similar RFIs, relating to similar equipment installations, in similar projects, etc. From this training data, the second machine-learning algorithm may determine that when these similarly-situated RFIs are addressed promptly, there is typically no impact on the project schedule. However, when the response time stretches longer than a certain threshold (e.g., three days), there is a significant increase in the likelihood that the RFI will impact the project schedule due to the sub-contractor's inability to continue with their work, leading to a cascade of delays.

Based on this information, the second machine-learning algorithm may determine a predicted edge, represented by the dashed line in FIG. 5B between the nodes 506 and 508, representing the relatively high likelihood that the RFI will impact the project schedule if certain other conditions are met—i.e., if the engineer fails to respond to the RFI within three days. Accordingly, the computing platform 400 may generate a notification that is presented to one or more of the engineer, the sub-contractor, and/or the superintendent that includes this information. In this way, the computing platform 400 and the construction knowledge graph 520 may provide valuable predictive insights regarding during the course of the construction project.

Turning now to FIG. 5C and continuing the present example, the resolution of the RFI may be a change order to relocate a portion of the air duct. Thus, the change order may be generated and submitted to the owner for approval via typical channels. In addition, as with the RFI, a new data asset is created corresponding to the change order and is received by the computing platform 400. The computing platform 400 may, determine a physical location within the construction project to which the change order is related, as above, and may associate the data asset corresponding to the change order with the determined location. In this case, the change order may be associated with the same (x,y,z) location as the RFI that triggered the change order. Accordingly, when the computing platform 400 adds the data asset corresponding to the change order to the construction knowledge graph 520 as node 509, the computing platform 400 may determine edges connecting the node 509 to the other nodes corresponding to the RFI, the engineer, and the sub-contractor. Further, the construction knowledge graph 520 may include a data asset corresponding to a cost estimate, represented by a node 510. Because the change order, as written, may involve additional costs, an edge between node 509 and node 510 may be determined representing that the change order "caused an increase to" the cost estimate.

As shown in FIG. 5C, the construction knowledge graph 520 may include numerous additional nodes related to other physical objects within the construction project, such as the node 512 corresponding to a wall and the node 513 corresponding to an electrical conduit. Each of data assets corresponding to these nodes may include an associated (x,y,z) location that reflects the location of each physical object within the construction project's coordinate system. Based on these (x,y,z) locations, specifically with respect to the (x,y,z) location of the air duct, the construction knowledge graph 520 may include edges that connect nodes 503 and 512, as well as 503 and 513. These edges may reflect a particular proximity relationship between the objects. The instance, these edges may represent that each of the wall and the electrical conduit "is within 5 meters of" the air duct. A similar edge may connect nodes 512 and 513, representing that the electrical conduit "is within 5 meters of" the wall, or perhaps more specifically, that the electrical conduit "is within 5 meters of" the wall.

Based on this information embedded within the construction knowledge graph 520, the second machine-learning algorithm may be capable of determining additional helpful insights. For instance, the second machine-learning algorithm may determine from the historical training data that similar change orders for similar equipment (e.g., air duct relocations greater than five lineal feet), across similar construction projects have a high probability of impacting adjacent objects that are within a certain proximity to the change, resulting in further change orders and project delay.

Based on this information, the second machine-learning algorithm may determine a first predicted edge, represented by the dashed line in FIG. 5C between the nodes 509 and 512, representing the relatively high likelihood that the change order will impact the wall, and a second predicted edge, represented by the dashed line in FIG. 5C between the nodes 509 and 513, representing the relatively high likelihood that the change order will impact the electrical conduit. Accordingly, the computing platform 400 may generate a notification that is presented to one or more of the engineer and the sub-contractor to notify them that the change order is likely to affect adjacent objects and should be reviewed for potential impacts to the wall and electrical conduit. Further, the computing platform 400 may generate a notification that is presented to an estimator, represented by node 511 in the construction knowledge graph 520, informing the estimator that the changes to the project cost estimate attributable to the change order may need to be adjusted.

Figure 6:
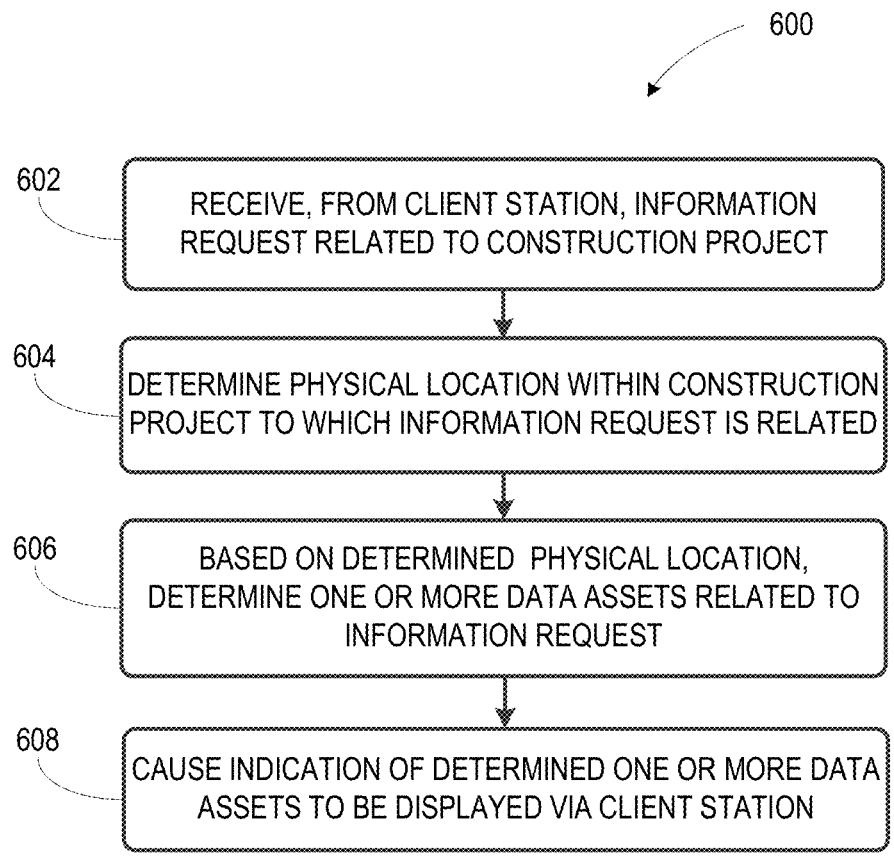
FIG. 6 depicts an example flow chart that may be carried out to facilitate using a construction knowledge graph to present information to a user.

Turning now to FIG. 6, a flow chart 600 is shown that includes example operations that may be carried out by a computing platform, such as the computing platform 400 of FIG. 4, to facilitate using a construction knowledge graph, such as the construction knowledge graph 420, to present information related to a construction project to a user. The example operations in FIG. 6 will be discussed with reference to FIGS. 7A-7B and FIG. 8.

Figure 7A:
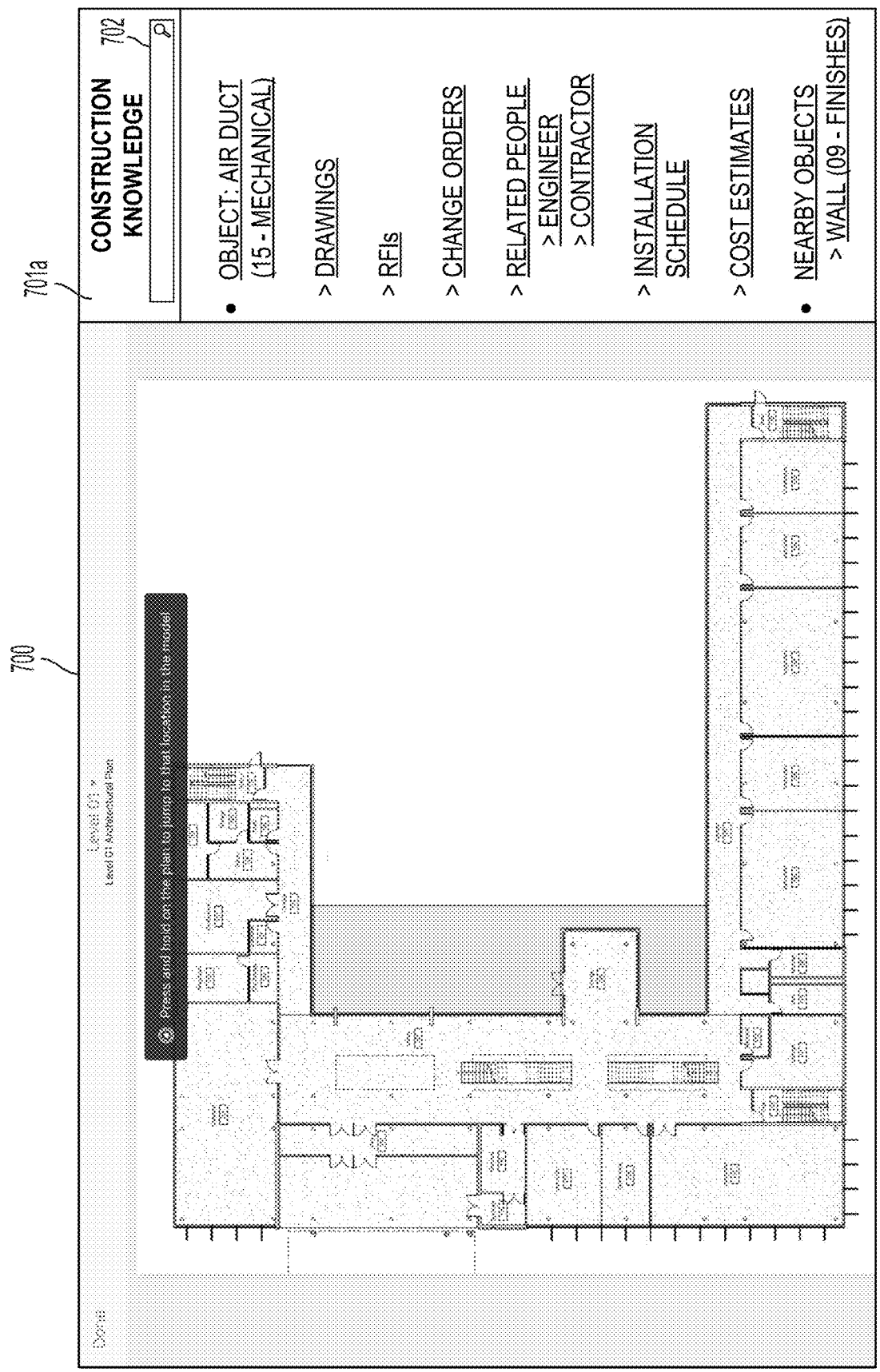
FIG. 7A depicts an example view of a GUI that may be presented to a user showing a two-dimensional construction drawing.

At block 602, the computing platform 400 may receive, from a client station, an information request related to a construction project. For example, FIG. 7A illustrates an example view of a GUI 700 that may be displayed on the client station 114 shown in FIG. 1. As shown in FIG. 7A, the GUI 700 depicts a visualization of a two-dimensional construction drawing for the construction project, which may be displayed via a software tool for viewing such drawings. In some implementations, the drawing viewer may be a stand-alone application running on the client station 114 as generally shown in FIG. 7A. In some other implementations, the drawing viewer may be included as a plug-in or similar component that is incorporated into a different software tool, such as an estimating tool or scheduling tool. In still further implementations, a software tool might not include a drawings visualization component at all.

Whatever its form, the client station 114 may provide the basis for receiving user inputs. For instance, when a user selects an area of the two-dimensional drawing displayed on the GUI 700 shown in FIG. 7A, the client station 114 may send an indication of the selection of the area to the computing platform 400, which may treat the selection as a request for information related to the selected area. Similarly, the user may select a particular object in the two-dimensional drawing, which the computing platform 400 may interpret as a request for information about the particular object. In this regard, the requests for information discussed above, may correspond to the information request 406 show in FIG. 4 and discussed above.

At block 604, the computing platform 400 may determine a physical location within the construction project to which the information request is related. For instance, where the information request takes the form of a selection of a two-dimensional drawing, or perhaps within a three-dimensional BIM file, the location of the selection (e.g., the location of a selected object) may be determined as the physical location within the construction project to which the request is related. In other examples, and information request may be directed to a different type of data asset, such as a change order. Accordingly, the computing platform 400 may determine the physical location that was associated with the change order when the change order was incorporated into the construction knowledge graph 420.

At block 606, the computing platform 400 may, based on the determined physical location, determine one or more data assets related to the information request. For example, the computing platform 400 may refer to the construction knowledge graph 420 to determine a set of data assets that are related to the determined physical location. The set of related data assets may be determined in various ways and may be based on other contextual information related to the information request, in addition to the determined physical location. For instance, the user of client station 114 may be represented by a node within the construction knowledge graph 420, and thus the computing platform 400 may determine data assets related to the information request with a preference for data assets that are more closely related to the user. In addition, the user may have an associated user profile that includes certain privileges and permissions for accessing certain types of data assets related to the construction project. Thus, the computing platform 400 may exclude data assets that the user is not authorized to access (e.g., contracts and/or invoices related to other users, etc.).

At block 608, the computing platform 400 may cause an indication of the determined one or more data assets to be displayed via the client station 114. In the example of FIG. 7A, the GUI 700 includes a construction knowledge pane 701a that displays a set of data assets based on the user's inputs. For instance, in response to a user selection an object (e.g., an air duct) on the two-dimensional construction drawing shown by GUI 700, the knowledge pane 701a may present a set of data assets to the user for further navigation. At a top-most level, a textual indication of the air duct is shown, which may take the form of a link that is further selectable to view additional properties of the air duct, such as its length, material specification, etc.

Additional links are provided in the construction knowledge pane 701a that indicate other data assets related to the air duct, such as a drawings link that lists all construction drawings that depict the air duct, RFI and change order links that may list all of the respective RFIs and change orders related to the air duct based on the construction knowledge graph 420. Further, a related people link is displayed, and is expanded in FIG. 7A to indicate an engineer and a contractor who are related to the air duct based on the construction knowledge graph 420. Still further, indications of both an installation schedule and cost estimates related to the air duct are provided, also based on the construction knowledge graph 420.

At the bottom of the construction knowledge pane 701a, an indication of nearby objects is also displayed, such as a nearby wall, even though such objects may be part of a different construction division and/or an entirely different work breakdown schedule. Nonetheless, the objects may be related due to their proximity, as reflected in the construction knowledge graph and discussed in previous examples.

As discussed above, because all of the information related to a construction project is so fundamentally tied to location, using location as the unifier to interconnect data assets and present information to users can be highly effective, allowing users to obtain desired information quickly and intuitively. In in this regard, the construction knowledge pane 701a may additionally include a search bar 702, into which the user might submit text-based queries (i.e., information requests) related to any of the construction project's data assets, such as a person, a drawing, or a particular RFI (e.g., identified by an RFI number). In response, the computing platform 400 may determine a physical location related to the information request, and then return a set of data assets similar to the example shown in FIG. 7A.

Further, as noted above, the knowledge pane 701a shown by way of example in FIG. 7A need not be tied to a drawing visualization component and may be implemented as part of other software tools as well.

Figure 7B:
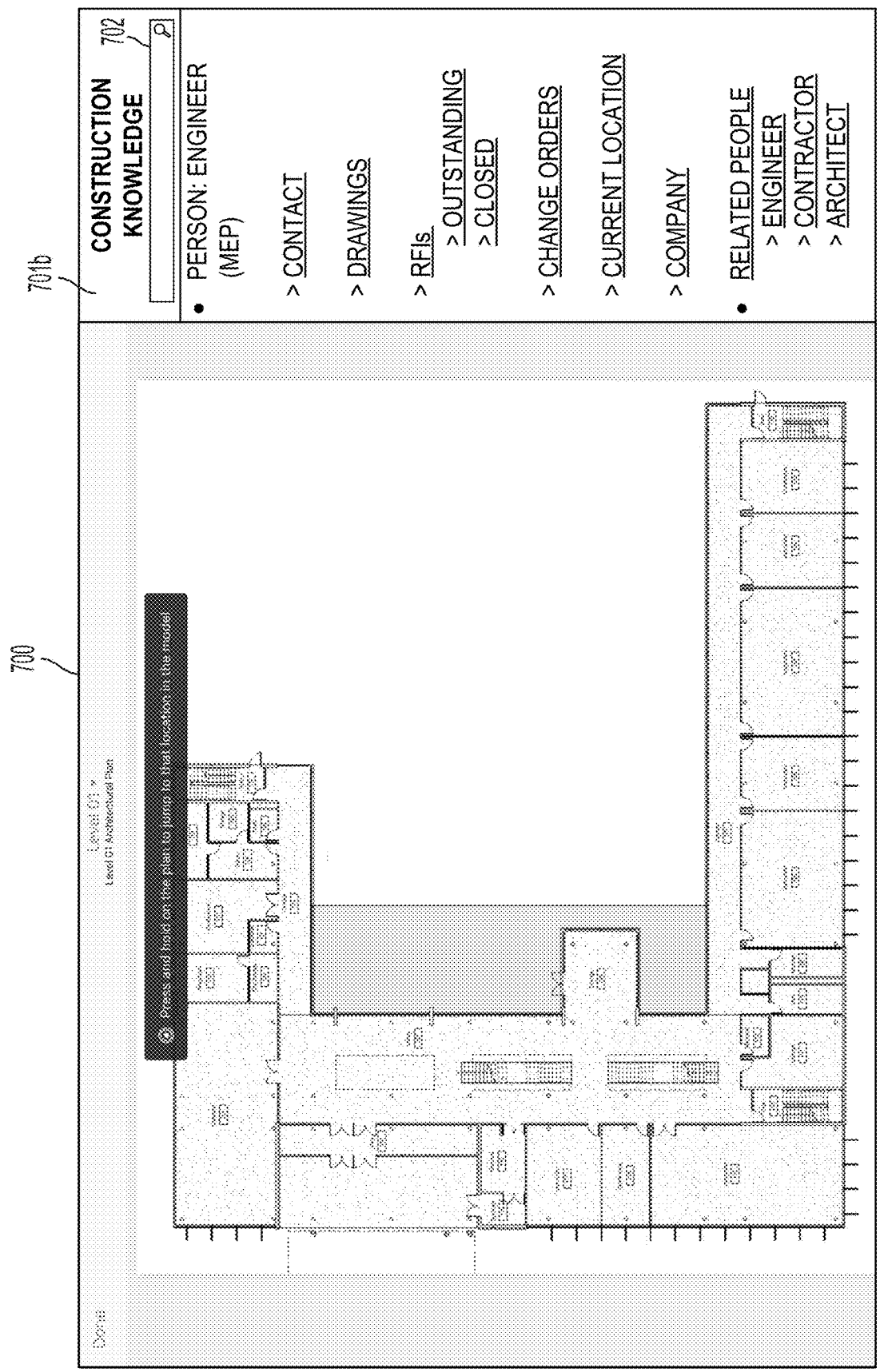
FIG. 7B depicts an example updated view of the GUI of FIG. 7A that may be presented to a user after the user interacts with a knowledge pane using the disclosed software technology.

Turning to FIG. 7B, and updated view of the GUI 700 from FIG. 7A is shown. In particular, although the user has not further manipulated the visualization of the two-dimensional drawing file, the user has made a selection within the construction knowledge pane 701a, and thus an updated construction knowledge pane 701b in shown. In particular, the user may have selected the indication of the "related people>engineer" and thus the construction knowledge pane is updated to display information related to the data asset corresponding to the engineer. For example, the construction knowledge pane 701b displays links for the engineers contact information, construction drawings that the engineering is related to, RFIs related to the engineer, including both outstanding and closed RFIs, as well as change orders.

In some implementations, a construction project might include a location tracking system (e.g., for safety purposes) such that it may be possible to determine a person's current location within the construction site. Further, the computing platform 400 may be updated with this information on an ongoing basis, such that the construction knowledge graph 420 may update the data assets related to people as they move around the project. In this way, a location request related to the engineer may return an option to view the engineer's current location on the construction project, as shown in the construction knowledge pane 701b.

Other data assets related to the engineer are shown in the construction knowledge pane 701b as well, such as a selectable link for the engineer's company, as well as another link populated with people related to the engineer based on the construction knowledge graph 420.

Figure 8:
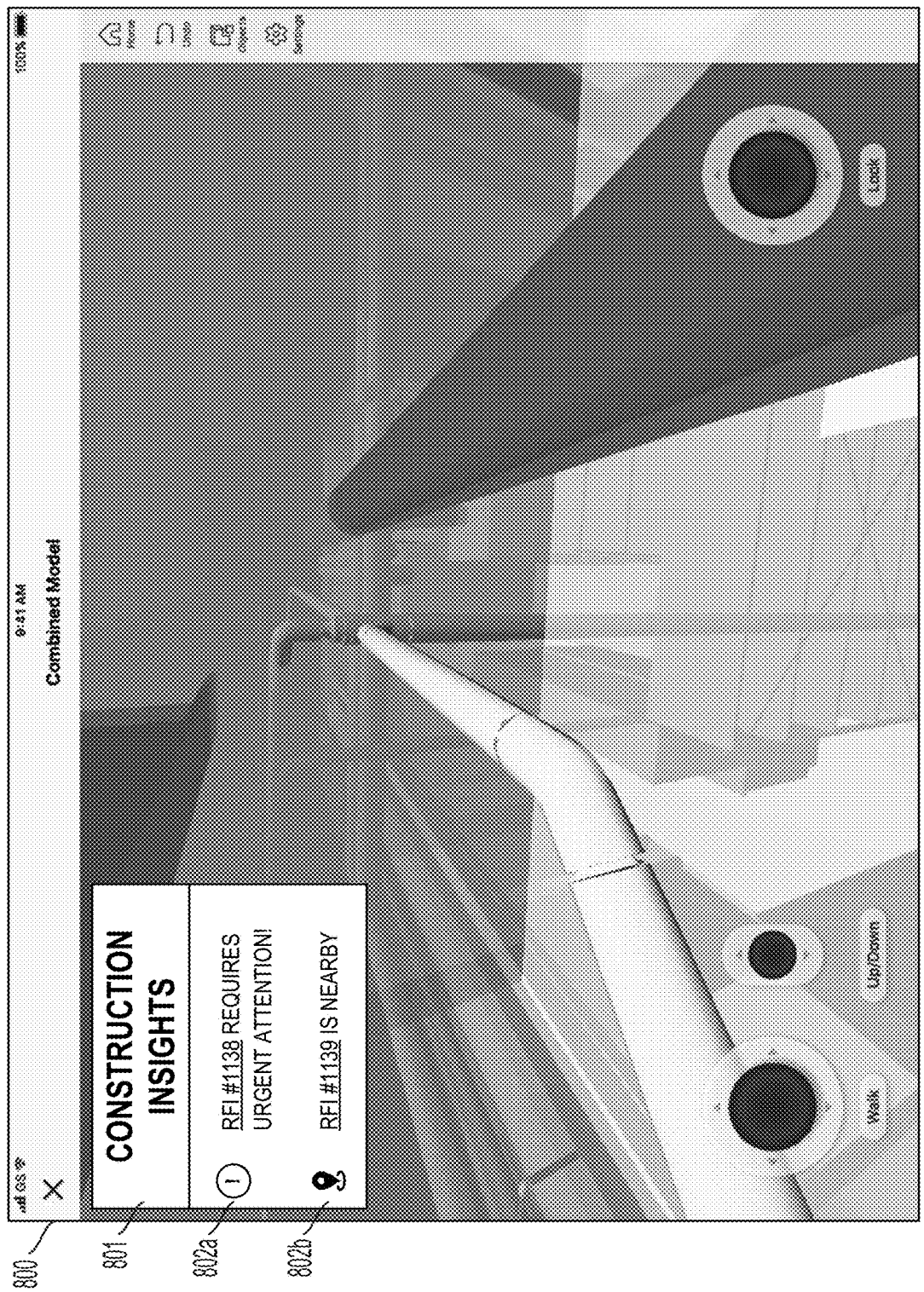
FIG. 8 depicts another example view of a GUI that may be presented to a user showing a visual representation of a three-dimensional model of a construction project.

FIG. 8 shows another example view of a GUI 800 that may be presented to a user of a client station, such as the client station 116 shown in FIG. 1. The GUI 800 shows a visual representation of a three-dimensional model of a construction project, such as a BIM file. For instance, the GUI includes controls that may be used to reposition or pan the view within the three-dimensional model, allowing the user to make selections similar to the examples discussed above in FIGS. 7A-7B. In response to such selections, the GUI 800 might be updated to display a construction knowledge pane, as in the previous examples.

However, in the example of FIG. 8 the user is using the client station 116 as a real-time visualization tool as the user moves throughout the construction project. In a related application, the client station 116 may take the form a virtual reality (VR) or augmented reality (AR) headset that updates the displayed visual representation in sync with the user's movements.

As the user is moving throughout the construction project with the client station 116, the computing platform 400 may generate one or more notifications for presentation to the user, as suggested in some of the examples above. For instance, the computing platform 400 may have determined that a particular RFI is predicted to impact the project schedule if the user does not respond to it within a certain time frame. Accordingly, the GUI 800 displayed by the user's client station 116 may be updated with a pop-up notification or similar alert that the RFI requires urgent attention. In the example of FIG. 8, the GUI 800 includes a dedicated construction insights pane 801 for displaying these types of notifications, including a notification 802a related to the urgent RFI.

As another example, the computing platform 400 may determine the user's location within the construction project as the user moves around with the client station 116. For example, the computing platform 400 may receive an indication of the current location of the client station 116 based on Bluetooth low energy (BLE) beacons use for localization, or from one or more other systems for determining the real-time location of users and/or devices within the construction project. Based on the current location of the user and/or the client station 116, the computing platform may determine that an RFI that requires the user's attention is associated with a physical location in the construction project that is within a threshold distance from the user (e.g., on the same floor, within 25 meters, etc.). Based on this determination, the computing platform 400 may generate a notification 802b for presentation to the user, informing the user that the physical location associated with the RFI is nearby. In FIG. 8, this notification 802b is provided in the construction insights pane 801.

For both the notification 802a and the notification 802b, the indication of the data asset in question, an RFI, may be presented as a selectable indication, allowing the user to follow the link and obtain additional information about the RFI. In this regard, the additional information may be displayed in an expanded version of the construction insights pane 801, or a separate construction knowledge pane, among various other possibilities

IV. CONCLUSION

Example embodiments of the disclosed innovations have been described above. Those skilled in the art will understand, however, that changes and modifications may be made to the embodiments described without departing from the true scope and spirit of the present invention, which will be defined by the claims.

Further, to the extent that examples described herein involve operations performed or initiated by actors, such as "humans," "operators," "users," or other entities, this is for purposes of example and explanation only. Claims should not be construed as requiring action by such actors unless explicitly recited in claim language.

The invention claimed is:

1. A computing platform comprising:
a network interface;
at least one processor;
non-transitory computer-readable medium; and
program instructions stored on the non-transitory computer-readable medium that are executable by the at least one processor such that the computing platform is configured to:
  receive an informational data asset that was generated via a given software tool and is related to a construction project;
  determine, via a machine-learning model, a physical location within the construction project to which the received informational data asset is related;
  store an association between the received informational data asset and the determined physical location;
  based on the determined physical location, determine one or more respective proximity relationships between the received informational data asset and one or more other data assets related to the construction project;
  add, to a construction knowledge graph, a node that represents the received informational data asset;
  add, to the construction knowledge graph, one or more respective edges that connect the node that represents the received informational data asset to one or more respective other nodes that represent the one or more other data assets, wherein each respective edge to a respective other node represents the respective proximity relationship between the received informational data asset and the other data asset represented by the respective other node as determined based on the physical location;
  cause a graphical user interface (GUI) on a client station associated with a user to display information related to the construction project;
  determine a current location, within the construction project, of the client station associated with the user;
  determine that the received informational data asset requires a response from the user;
  determine, based on the construction knowledge graph, that the determined physical location to which the received informational data asset is related is within a threshold distance from the current location of the client station;
  based on determining that the determined physical location to which the received informational data asset is related is within a threshold distance from the current location of the client station, generate a notification for presentation to the user, the notification informing the user that the determined physical location to which the received informational data asset is related is nearby;
  cause the notification to be displayed via the GUI of the client station, wherein the displayed notification is selectable to obtain additional information about the received informational data asset; and
  after receiving an indication of a user selection of the notification, cause the additional information to be displayed via the GUI of the client station.

2. The computing platform of claim 1, wherein the program instructions that are executable to determine, via the machine-learning model, the physical location within the construction project to which the received informational data asset is related comprise program instructions that are executable to:
identify, within the received informational data asset, an indication of at least one of the one or more other data assets, wherein the at least one of the one or more other data assets is related to the determined physical location.

3. The computing platform of claim 2, wherein the program instructions that are executable to identify, within the received informational data asset, an indication of at least one of the one or more other data assets comprise program instructions that are executable to:
identify an indication of a design object that is associated with location coordinates within the construction project; and
determine that the location coordinates associated with the design object are the determined physical location within the construction project to which the received informational data asset is related.

4. The computing platform of claim 1, wherein the program instructions that are executable to determine the one or more respective proximity relationships between the received informational data asset and one or more other data assets comprise program instructions that are executable to:
determine that the determined physical location to which the received informational data asset is related is within a threshold distance from a physical location associated with the one or more other data assets.

5. The computing platform of claim 1, wherein the program instructions that are executable to determine the one or more respective proximity relationships between the received informational data asset and one or more other data assets comprise program instructions that are executable to:

determine a predicted proximity relationship between the received informational data asset and a currently unrelated data asset.

6. The computing platform of claim 5, further comprising program instructions stored on the non-transitory computer-readable medium that are executable by the at least one processor such that the computing platform is configured to:
   determine a node within the construction knowledge graph that (i) corresponds to the user and (ii) is related to the received informational data asset; and
   generate a notification of the predicted proximity relationship for presentation on the client station associated with the user.

7. The computing platform of claim 1, wherein each respective edge between the node that represents the received informational data asset and a respective other node in the construction knowledge graph comprises a respective edge that characterizes the respective proximity relationship between the received informational data asset and the other data asset represented by the respective other node.

8. A non-transitory computer-readable medium, wherein the non-transitory computer-readable medium is provisioned with program instructions that, when executed by at least one processor, cause a computing platform to:
   receive an informational data asset that was generated via a given software tool and is related to a construction project;
   determine, via a machine-learning model, a physical location within the construction project to which the received informational data asset is related;
   store an association between the received informational data asset and the determined physical location;
   based on the determined physical location, determine one or more respective proximity relationships between the received informational data asset and one or more other data assets related to the construction project;
   add, to a construction knowledge graph, a node that represents the received informational data asset;
   add, to the construction knowledge graph, one or more respective edges that connect the node that represents the received informational data asset to one or more respective other nodes that represent the one or more other data assets, wherein each respective edge to a respective other node represents the respective proximity relationship between the received informational data asset and the other data asset represented by the respective other node as determined based on the physical location;
   cause a graphical user interface (GUI) on a client station associated with a user to display information related to the construction project;
   determine a current location, within the construction project, of the client station associated with the user;
   determine that the received informational data asset requires a response from the user;
   determine, based on the construction knowledge graph, that the determined physical location to which the received informational data asset is related is within a threshold distance from the current location of the client station;
   based on determining that the determined physical location to which the received informational data asset is related is within a threshold distance from the current location of the client station, generate a notification for presentation to the user, the notification informing the user that the determined physical location to which the data asset is related is nearby;
   cause the notification to be displayed via the GUI of the client station, wherein the displayed notification is selectable to obtain additional information about the received informational data asset; and
   after receiving an indication of a user selection of the notification, cause the additional information to be displayed via the GUI of the client station.

9. The non-transitory computer-readable medium of claim 8, wherein the program instructions that cause the computing platform to determine, via the machine-learning model, the physical location within the construction project to which the received informational data asset is related comprise program instructions that cause the computing platform to:
   identify, within the received informational data asset, an indication of at least one of the one or more other data assets, wherein the at least one of the one or more other data assets is related to the determined physical location.

10. The non-transitory computer-readable medium of claim 9, wherein the program instructions that cause the computing platform to identify, within the received informational data asset, an indication of at least one of the one or more other data assets comprise program instructions that cause the computing platform to:
   identify an indication of a design object that is associated with location coordinates within the construction project; and
   determine that the location coordinates associated with the design object are the determined physical location within the construction project to which the received informational data asset is related.

11. The non-transitory computer-readable medium of claim 8, wherein the program instructions that cause the computing platform to determine the one or more respective proximity relationships between the received informational data asset and one or more other data assets comprise program instructions that cause the computing platform to:
   determine that the determined physical location associated with the received informational data asset is within a threshold distance from a physical location associated with the one or more other data assets.

12. The non-transitory computer-readable medium of claim 8, wherein the program instructions that cause the computing platform to determine the one or more respective proximity relationships between the received informational data asset and one or more other data assets comprise program instructions that cause the computing platform to:
   determine a predicted proximity relationship between the received informational data asset and a currently unrelated data asset.

13. The non-transitory computer-readable medium of claim 12, wherein the non-transitory computer-readable medium is also provisioned with program instructions that, when executed by at least one processor, cause the computing platform to:
   determine a node within the construction knowledge graph that (i) corresponds to the user and (ii) is related to the received informational data asset; and
   generate a notification of the predicted proximity relationship for presentation on the client station associated with the user.

14. The non-transitory computer-readable medium of claim 8, wherein each respective edge between the node that represents the received informational data asset and a respective other node in the construction knowledge graph comprises a respective edge that characterizes the respective proximity relationship between the received informational data asset and the other data asset represented by the respective other node.

15. A method carried out by a computing platform, the method comprising:
receiving an informational data asset that was generated via a given software tool and is related to a construction project;
determining, via a machine-learning model, a physical location within the construction project to which the received informational data asset is related;
store an association between the received informational data asset and the determined physical location;
based on the determined physical location, determining one or more respective proximity relationships between the received informational data asset and one or more other data assets related to the construction project;
adding, to a construction knowledge graph, a node that represents the received informational data asset;
adding, to the construction knowledge graph, one or more respective edges that connect the node that represents the received informational data asset to one or more respective other nodes that represent the one or more other data assets, wherein each respective edge to a respective other node represents the respective proximity relationship between the received informational data asset and the other data asset represented by the respective other node as determined based on the physical location;
causing a graphical user interface (GUI) on a client station associated with a user to display information related to the construction project;
determining a current location, within the construction project, of the client station associated with the user;
determining that the received informational data asset requires a response from the user;
determining, based on the construction knowledge graph, that the determined physical location to which the received informational data asset is related is within a threshold distance from the current location of the client station;
based on determining that the determined physical location to which the received informational data asset is related is within a threshold distance from the current location of the client station, generating a notification for presentation to the user, the notification informing the user that the determined physical location to which the received informational data asset is related is nearby;
causing the notification to be displayed via the GUI of the client station, wherein the displayed notification is selectable to obtain additional information about the received informational data asset; and
after receiving an indication of a user selection of the notification, causing the additional information to be displayed via the GUI of the client station.

16. The method of claim 15, wherein determining, via the machine-learning model, the physical location within the construction project to which the received informational data asset is related comprises:
identifying, within the received informational data asset, an indication of at least one of the one or more other data assets, wherein the at least one of the one or more other data assets is related to the determined physical location.

17. The method of claim 16, wherein identifying, within the received informational data asset, an indication of at least one of the one or more other data assets comprises:
identifying an indication of a design object that is associated with location coordinates within the construction project; and
determining that the location coordinates associated with the design object are the determined physical location within the construction project to which the received informational data asset is related.

18. The method of claim 15, wherein determining the one or more respective proximity relationships between the received informational data asset and one or more other data assets comprises:
determining that the determined physical location to which the received informational data asset is related is within a threshold distance from a physical location associated with the one or more other data assets.

19. The method of claim 15, wherein determining the one or more respective proximity relationships between the received informational data asset and one or more other data assets comprises:
determining a predicted proximity relationship between the received informational data asset and a currently unrelated data asset.

20. The method of claim 19, further comprising:
determining a node within the construction knowledge graph that (i) corresponds to the user and (ii) is related to the received informational data asset; and
generating a notification of the predicted proximity relationship for presentation on the client station associated with the user.

21. The computing platform of claim 1, wherein the notification is a first notification, the computing platform further comprising program instructions stored on the non-transitory computer-readable medium that are executable by the at least one processor such that the computing platform is configured to:
determine, based on a respective edge within the construction knowledge graph between the node that represents the received informational data asset and a respective other node representing a project schedule, that the received informational data asset is predicted to impact the project schedule if the user does not respond to the received informational data asset within a threshold response time;
based on determining the predicted impact to the project schedule, generate a second notification for presentation to the user, the second notification informing the user that the received informational data asset requires urgent attention; and
cause the second notification to be displayed via the GUI of the client station.

* * * * *